(12) United States Patent
Brenner et al.

(10) Patent No.: US 8,398,896 B2
(45) Date of Patent: Mar. 19, 2013

(54) ALUMINUM PASTES AND USE THEREOF IN THE PRODUCTION OF SILICON SOLAR CELLS

(75) Inventors: Peter Brenner, Gloucestershire (GB); Alistair Graeme Prince, Bristol (GB); Richard John Sheffield Young, Somerset (GB)

(73) Assignee: E I du Pont de Nemours and Company, Wilmington, DE (US)

( * ) Notice: Subject to any disclaimer, the term of this patent is extended or adjusted under 35 U.S.C. 154(b) by 734 days.

(21) Appl. No.: 12/554,096

(22) Filed: Sep. 4, 2009

(65) Prior Publication Data

US 2010/0059116 A1    Mar. 11, 2010

Related U.S. Application Data

(60) Provisional application No. 61/094,458, filed on Sep. 5, 2008.

(51) Int. Cl.
*H01B 1/22* (2006.01)
*B05D 5/12* (2006.01)
*H01L 31/0224* (2006.01)

(52) U.S. Cl. .......................... 252/512; 427/74; 136/256

(58) Field of Classification Search .......... 252/512–514; 136/252–256; 427/74
See application file for complete search history.

(56) References Cited

U.S. PATENT DOCUMENTS

| | | | | |
|---|---|---|---|---|
| 4,617,056 | A | * | 10/1986 | Mosser et al. ............... 106/1.12 |
| 4,724,172 | A | * | 2/1988 | Mosser et al. ............. 427/383.5 |
| 5,066,540 | A | * | 11/1991 | Mosser et al. ............... 428/336 |
| 7,790,063 | B2 | * | 9/2010 | Kuwajima .................... 252/512 |
| 2007/0079868 | A1 | | 4/2007 | Rose et al. |
| 2009/0229665 | A1 | * | 9/2009 | Young et al. .................. 136/261 |
| 2009/0255583 | A1 | * | 10/2009 | Young et al. .................. 136/261 |

FOREIGN PATENT DOCUMENTS

| | | | |
|---|---|---|---|
| EP | 1 400 987 | A2 | 3/2004 |
| EP | 1 775 776 | A1 | 4/2007 |
| JP | 2002 076398 | A | 3/2002 |
| JP | 2007 224191 | A | 9/2007 |
| WO | WO 2010/117207 | | * 10/2010 |

OTHER PUBLICATIONS

International Search Report for International Application No. PCT/US2009/056156 Dated Nov. 30, 2009.

* cited by examiner

*Primary Examiner* — Mark Kopec

(57) ABSTRACT

Described are aluminum pastes comprising spherical-shaped and nodular-shaped particulate aluminum and an organic vehicle and their use in forming p-type aluminum back electrodes of silicon solar cells.

13 Claims, 2 Drawing Sheets

ALUMINUM PASTES AND USE THEREOF IN THE PRODUCTION OF SILICON SOLAR CELLS

FIELD OF THE INVENTION

The present invention is directed to aluminum pastes, and their use in the production of silicon solar cells, i.e., in the production of aluminum back electrodes of silicon solar cells and the respective silicon solar cells.

TECHNICAL BACKGROUND OF THE INVENTION

A conventional solar cell structure with a p-type base has a negative electrode that is typically on the front-side or sun side of the cell and a positive electrode on the back. It is well known that radiation of an appropriate wavelength falling on a p-n junction of a semiconductor body serves as a source of external energy to generate electron-hole pairs in that body. The potential difference that exists at a p-n junction, causes holes and electrons to move across the junction in opposite directions, thereby giving rise to flow of an electric current that is capable of delivering power to an external circuit. Most solar cells are in the form of a silicon wafer that has been metallized, i.e., provided with metal contacts which are electrically conductive.

During the formation of a silicon solar cell, an aluminum paste is generally screen printed and dried on the back-side of the silicon wafer. The wafer is then fired at a temperature above the melting point of aluminum to form an aluminum-silicon melt, subsequently, during the cooling phase, an epitaxially grown layer of silicon is formed that is doped with aluminum. This layer is generally called the back surface field (BSF) layer, and helps to improve the energy conversion efficiency of the solar cell.

Most electric power-generating solar cells currently used are silicon solar cells. Process flow in mass production is generally aimed at achieving maximum simplification and minimizing manufacturing costs. Electrodes in particular are made by using a method such as screen printing from a metal paste.

An example of this method of production is described below in conjunction with FIG. 1. FIG. 1A shows a p-type silicon substrate, 10.

In FIG. 1B, an n-type diffusion layer, 20, of the reverse conductivity type is formed by the thermal diffusion of phosphorus (P) or the like. Phosphorus oxychloride ($POCl_3$) is commonly used as the gaseous phosphorus diffusion source, other liquid sources are phosphoric acid and the like. In the absence of any particular modification, the diffusion layer, 20, is formed over the entire surface of the silicon substrate, 10. The p-n junction is formed where the concentration of the p-type dopant equals the concentration of the n-type dopant; conventional cells that have the p-n junction close to the sun side, have a junction depth between 0.05 and 0.5 µm.

After formation of this diffusion layer excess surface glass is removed from the rest of the surfaces by etching by an acid such as hydrofluoric acid.

Next, an antireflective coating (ARC), 30, is formed on the n-type diffusion layer, 20, to a thickness of between 0.05 and 0.1 µm in the manner shown in FIG. 1D by a process, such as, for example, plasma chemical vapor deposition (CVD).

As shown in FIG. 1E, a front-side silver paste (front electrode-forming silver paste), 500, for the front electrode is screen printed and then dried over the antireflective coating, 30. In addition, a back-side silver or silver/aluminum paste, 70, and an aluminum paste, 60, are then screen printed (or some other application method) and successively dried on the back-side of the substrate. Normally, the back-side silver or silver/aluminum paste is screen printed onto the silicon first as two parallel strips (busbars) or as rectangles (tabs) ready for soldering interconnection strings (presoldered copper ribbons), the aluminum paste is then printed in the bare areas with a slight overlap over the back-side silver or silver/aluminum. In some cases, the silver or silver/aluminum paste is printed after the aluminum paste has been printed. Firing is then typically carried out in a belt furnace for a period of 1 to 5 minutes with the wafer reaching a peak temperature in the range of 700 to 900° C. The front and back electrodes can be fired sequentially or cofired.

Consequently, as shown in FIG. 1F, molten aluminum from the paste dissolves the silicon during the firing process and then on cooling forms a eutectic layer that epitaxially grows from the silicon base, 10, forming a p+ layer, 40, containing a high concentration of aluminum dopant. This layer is generally called the back surface field (BSF) layer, and helps to improve the energy conversion efficiency of the solar cell. A thin layer of aluminum is generally present at the surface of this epitaxial layer.

The aluminum paste is transformed by firing from a dried state, 60, to an aluminum back electrode, 61. The back-side silver or silver/aluminum paste, 70, is fired at the same time, becoming a silver or silver/aluminum back electrode, 71. During firing, the boundary between the back-side aluminum and the back-side silver or silver/aluminum assumes an alloy state, and is connected electrically as well. The aluminum electrode accounts for most areas of the back electrode, owing in part to the need to form a p+ layer, 40. A silver or silver/aluminum back electrode is formed over portions of the back-side (often as 2 to 6 mm wide busbars) as an electrode for interconnecting solar cells by means of pre-soldered copper ribbon or the like. In addition, the front-side silver paste, 500, sinters and penetrates through the antireflective coating, 30, during firing, and is thereby able to electrically contact the n-type layer, 20. This type of process is generally called "firing through". This fired through state is apparent in layer 501 of FIG. 1F.

Such aluminum pastes as mentioned above have been disclosed in many patent applications, for example, in US-A-2007/0079868. In the latter it is disclosed that the aluminum powder contained in the aluminum pastes may comprise atomized aluminum. The aluminum may be atomized in either air or inert atmosphere.

Silicon solar cells made from silicon wafers and having an aluminum back electrode are silicon/aluminum bimetallic strips and may exhibit a so-called bowing behavior. Bowing is undesirable in that it might lead to cracking and breaking of the solar cells. Bowing also causes problems with regard to processing of the silicon wafers. During processing the silicon wafers are generally lifted up making use of automated handling equipment using suction pads which may not work reliably in case of excessive bowing. Bowing requirements within the photovoltaic industry are typically <1.5 mm deflection of the solar cells. Overcoming the bowing phenomenon is a challenge especially with a view to silicon solar cells made from large and/or thin silicon wafers, for example, silicon wafers having a thickness below 180 µm, in particular, in the range of 120 to below 180 µm and an area in the range of above 250 to 400 $cm^2$.

SUMMARY OF THE INVENTION

The present invention relates to aluminum pastes (aluminum thick film compositions) for use in forming p-type aluminum back electrodes of silicon solar cells. It further relates to the process of forming and use of the aluminum pastes in the production of silicon solar cells and the silicon solar cells themselves.

The present invention is directed to aluminum pastes comprising: particulate aluminum, an organic vehicle and, optionally, one or more glass frit compositions, wherein the particulate aluminum comprises 30 to 90 wt. % (weight percent) of spherical-shaped aluminum powder and 10 to 70 wt. % of nodular-shaped (irregular-shaped) aluminum powder, the wt. % being based on the sum of the spherical-shaped aluminum powder and the nodular-shaped aluminum powder.

The present invention is further directed to a process of forming a silicon solar cell and the silicon solar cell itself which utilizes a silicon wafer having a p-type and an n-type region, and a p-n junction, which comprises applying, in particular, screen-printing an aluminum paste of the present invention on the back-side of the silicon wafer, and firing the printed surface, whereby the wafer reaches a peak temperature in the range of 700 to 900° C.

DETAILED DESCRIPTION OF THE INVENTION

Figure 1A:
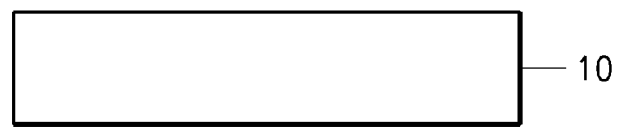
FIG. 1 is a process flow diagram illustrating exemplary the fabrication of a silicon solar cell.
Reference numerals shown in FIG. 1 are explained below.
10: p-type silicon wafer
20: n-type diffusion layer
30: antireflective coating, for example, SiNx, TiOx, SiOx
40: p+ layer (back surface field, BSF)
60: aluminum paste formed on back-side
61: aluminum back electrode (obtained by firing back-side aluminum paste)
70: silver or silver/aluminum paste formed on back-side
71: silver or silver/aluminum back electrode (obtained by firing back-side silver or silver/aluminum paste)
500: silver paste formed on front-side
501: silver front electrode (obtained by firing front-side silver paste)
FIGS. 2A-D explain the manufacturing process for manufacturing a silicon solar cell using an electroconductive aluminum paste of the present invention. Reference numerals shown in FIG. 2 are explained below.
102 silicon substrate (silicon wafer)
104 light-receiving surface side electrode
106 paste composition for a first electrode
108 electroconductive paste for a second electrode
110 first electrode
112 second electrode
Figure 1B:
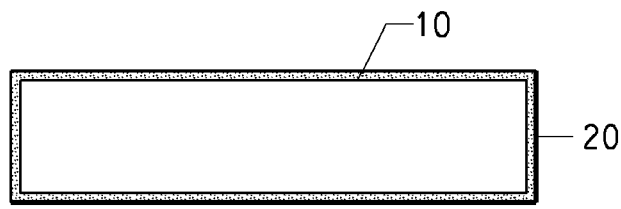
Figure 1C:
Figure 1D:
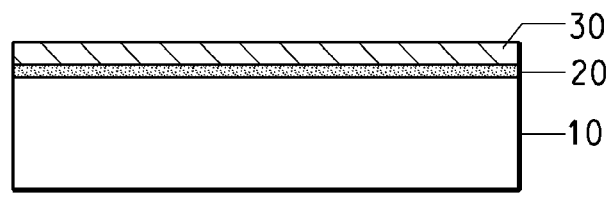
Figure 1E:
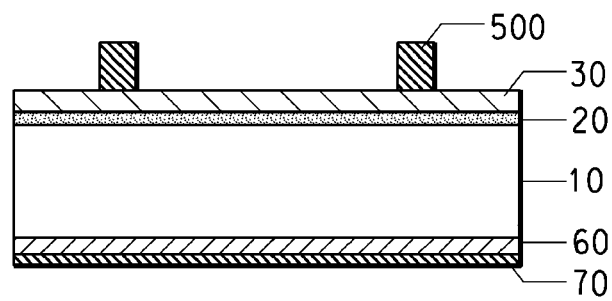
Figure 1F:
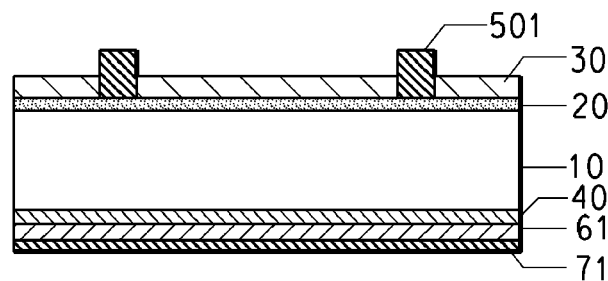

It has now been found that aluminum thick film compositions which contain spherical-shaped aluminum powder and nodular-shaped aluminum powder in the specific weight ratio specified above exhibit good and well-balanced overall properties with regard to bowing and electrical performance of silicon solar cells made therewith. Use of said novel aluminum thick film compositions in the production of aluminum back electrodes of silicon solar cells results in silicon solar cells exhibiting not only low bowing behavior and good electrical performance but also reduces or even eliminates the tendency for adhesion loss between the aluminum back electrode and the silicon wafer substrate. Good adhesion between the aluminum back electrode and the silicon wafer substrate leads to a prolonged durability or service life of the silicon solar cells. It is also advantageous, that the thickness of the Al—Si eutectic layer and the back surface field obtained using the aluminum pastes of the present invention is very uniform.

The aluminum pastes of the present invention comprise particulate aluminum and an organic vehicle (organic medium), wherein the particulate aluminum comprises 30 to 90 wt. % of spherical-shaped aluminum powder and 10 to 70 wt. % of nodular-shaped aluminum powder, the wt. % being based on the sum of the spherical-shaped aluminum powder and the nodular-shaped aluminum powder. In an embodiment, the sum of spherical-shaped plus nodular-shaped aluminum powder accounts for more than 90 wt. % of the particulate aluminum. In a further embodiment, it accounts for 100 wt. % of the particulate aluminum.

The particulate aluminum may be comprised of aluminum or an aluminum alloy with one or more other metals like, for example, zinc, tin, silver and magnesium. In case of aluminum alloys the aluminum content is, for example, 99.7 to below 100 wt. %.

As previously mentioned, the particulate aluminum comprises 30 to 90 wt. % of spherical-shaped aluminum powder and 10 to 70 wt. % of nodular-shaped aluminum powder, the wt. % being based on the sum of the spherical-shaped aluminum powder and the nodular-shaped aluminum powder. In an embodiment, it consists of 30 to 90 wt. % spherical-shaped aluminum powder and 10 to 70 wt. % nodular-shaped aluminum powder, wherein the sum of the wt. % totals 100 wt. %.

In a further embodiment, the particulate aluminum comprises 50 to 75 wt. % of spherical-shaped aluminum powder and 25 to 50 wt. % of nodular-shaped aluminum powder, the wt. % being based on the sum of the spherical-shaped aluminum powder and the nodular-shaped aluminum powder. In another embodiment, it consists of 50 to 75 wt. % spherical-shaped aluminum powder and 25 to 50 wt. % nodular-shaped aluminum powder, wherein the sum of the wt. % totals 100 wt. %.

In still another embodiment, the particulate aluminum comprises 60 to 70 wt. % of spherical-shaped aluminum powder and 30 to 40 wt. % of nodular-shaped aluminum powder, the wt. % being based on the sum of the spherical-shaped aluminum powder and the nodular-shaped aluminum powder. In an embodiment, it consists of 60 to 70 wt. % spherical-shaped aluminum powder and 30 to 40 wt. % nodular-shaped aluminum powder, wherein the sum of the wt. % totals 100 wt. %.

The term "spherical-shaped aluminum powder" is used herein. It means that the individual aluminum particles when looked at under the microscope have a ball like or near-to-ball like shape, i.e., they may be perfectly round or slightly elliptical. Spherical-shaped aluminum powders are typically made by atomization of liquid aluminum in an inert gas atmosphere with a low oxygen content of, for example, less than 5 to 0 volume-%, for example, a nitrogen or argon atmosphere. An example of a commercially available spherical-shaped aluminum powder that can be used in the aluminum pastes of the present invention is the product ULT-0665 from Poudres-Hermillon.

The term "nodular-shaped aluminum powder" is used herein. It means that the individual aluminum particles when looked at under the microscope do not have a spherical shape. They have an irregular but compact shape, i.e. they have a low aspect ratio, and they shall not be confused with aluminum flakes or aluminum platelets. Nodular-shaped aluminum powders are typically made by atomization of liquid aluminum in air. An example of a commercially available nodular-shaped aluminum powder that can be used in the aluminum pastes of the present invention is the product 1401/S2 from Alcoa.

Both, the spherical-shaped aluminum powder and the nodular-shaped aluminum powder exhibit an average particle size (mean particle diameter, d50) determined by means of laser scattering of, for example, 4 to 12 µm. The particulate aluminum may be present in the aluminum pastes of the present invention in a proportion of 50 to 80 wt. %, or, in an embodiment, 70 to 75 wt. %, based on total aluminum paste composition.

All statements made in the present description and the claims in relation to average particle sizes relate to average particle sizes of the relevant materials as are present in the aluminum paste composition.

The particulate aluminum present in the aluminum pastes may be accompanied by other particulate metal(s) such as, for example, silver or silver alloy powders. The proportion of such other particulate metal(s) is, for example, 0 to 10 wt. %, based on the total of particulate aluminum plus particulate metal(s).

In an embodiment, the aluminum pastes of the present invention comprise also one or more glass frits as inorganic binder. The glass frit compositions may contain PbO; in an embodiment, the glass frit compositions may be lead-free. The glass frit compositions may comprise those which upon firing undergo recrystallization or phase separation and liberate a frit with a separated phase that has a lower softening point than the original softening point.

The (original) softening point (glass transition temperature, determined by differential thermal analysis DTA at a heating rate of 10 K/min) of the glass frit compositions may be in the range of 325 to 600° C.

The glass frits exhibit average particle sizes (mean particle diameters) determined by means of laser scattering of, for example, 2 to 20 µm. In case of the aluminum pastes comprising glass-frit(s) the glass frit(s) content may be 0.01 to 5 wt. %, or, in an embodiment, 0.1 to 2 wt. %, or, in a further embodiment, 0.2 to 1.25 wt. %, based on total aluminum paste composition.

Some of the glass frits useful in the aluminum pastes are conventional in the art. Some examples include borosilicate and aluminosilicate glasses. Examples further include combinations of oxides, such as: $B_2O_3$, $SiO_2$, $Al_2O_3$, CdO, CaO, BaO, ZnO, $Na_2O$, $Li_2O$, PbO, and $ZrO_2$ which may be used independently or in combination to form glass binders.

The conventional glass frits may be the borosilicate frits, such as lead borosilicate frit, bismuth, cadmium, barium, calcium, or other alkaline earth borosilicate frits. The preparation of such glass frits is well known and consists, for example, in melting together the constituents of the glass in the form of the oxides of the constituents and pouring such molten composition into water to form the frit. The batch ingredients may, of course, be any compounds that will yield the desired oxides under the usual conditions of frit production. For example, boric oxide will be obtained from boric acid, silicon dioxide will be produced from flint, barium oxide will be produced from barium carbonate, etc.

The glass may be milled in a ball mill with water or inert low viscosity, low boiling point organic liquid to reduce the particle size of the frit and to obtain a frit of substantially uniform size. It may then be settled in water or said organic liquid to separate fines and the supernatant fluid containing the fines may be removed. Other methods of classification may be used as well.

The glasses are prepared by conventional glassmaking techniques, by mixing the desired components in the desired proportions and heating the mixture to form a melt. As is well known in the art, heating may be conducted to a peak temperature and for a time such that the melt becomes entirely liquid and homogeneous.

The aluminum pastes of the present invention comprise an organic vehicle. A wide variety of inert viscous materials can be used as organic vehicle. The organic vehicle may be one in which the particulate constituents (particulate aluminum, glass frit if any) are dispersible with an adequate degree of stability. The properties, in particular, the rheological properties, of the organic vehicle may be such that they lend good application properties to the aluminum paste composition, including: stable dispersion of insoluble solids, appropriate viscosity and thixotropy for application, in particular, for screen printing, appropriate wettability of the silicon wafer substrate and the paste solids, a good drying rate, and good firing properties. The organic vehicle used in the aluminum pastes of the present invention may be a nonaqueous inert liquid. The organic vehicle may be an organic solvent or an organic solvent mixture; in an embodiment, the organic vehicle may be a solution of organic polymer(s) in organic solvent(s). In an embodiment, the polymer used for this purpose may be ethyl cellulose. Other examples of polymers which may be used alone or in combination include ethylhydroxyethyl cellulose, wood rosin, phenolic resins and poly (meth)acrylates of lower alcohols. Examples of suitable organic solvents comprise ester alcohols and terpenes such as alpha- or beta-terpineol or mixtures thereof with other solvents such as kerosene, dibutylphthalate, diethylene glycol butyl ether, diethylene glycol butyl ether acetate, hexylene glycol and high boiling alcohols. In addition, volatile organic solvents for promoting rapid hardening after application of the aluminum paste on the backside of the silicon wafer can be included in the organic vehicle. Various combinations of these and other solvents may be formulated to obtain the viscosity and volatility requirements desired.

The organic solvent content in the aluminum pastes of the present invention may be in the range of 5 to 25 wt. %, or, in an embodiment, 10 to 20 wt. %, based on total aluminum paste composition.

The organic polymer(s) may be present in the organic vehicle in a proportion in the range of 0 to 20 wt. %, or, in an embodiment, 5 to 10 wt. %, based on total aluminum paste composition.

The aluminum pastes of the present invention may comprise refractory inorganic compounds and/or metal-organic compounds. "Refractory inorganic compounds" refers to inorganic compounds that are resistant to the thermal conditions experienced during firing. For example, they have melting points above the temperatures experienced during firing. Examples include inorganic oxides, for example, amorphous silicon dioxide. Examples of metal-organic compounds include tin- and zinc-organic compounds such as zinc neodecanoate and tin(II) 2-ethylhexanoate.

The aluminum pastes of the present invention may comprise one or more organic additives, for example, surfactants, thickeners, rheology modifiers and stabilizers. The organic additive(s) may be part of the organic vehicle. However, it is also possible to add the organic additive(s) separately when preparing the aluminum pastes. The organic additive(s) may be present in the aluminum pastes of the present invention in a total proportion of, for example, 0 to 10 wt. %, based on total aluminum paste composition.

The organic vehicle content in the aluminum pastes of the present invention may be dependent on the method of applying the paste and the kind of organic vehicle used, and it can vary. In an embodiment, it may be from 20 to 45 wt. %, or, in an embodiment, it may be in the range of 22 to 35 wt. %, based on total aluminum paste composition. The number of 20 to 45 wt. % includes organic solvent(s), possible organic polymer (s) and possible organic additive(s).

The aluminum pastes of the present invention are viscous compositions, which may be prepared by mechanically mixing the particulate aluminum and the optional glass frit composition(s) with the organic vehicle. In an embodiment, the manufacturing method power mixing, a dispersion technique that is equivalent to the traditional roll milling, may be used; roll milling or other mixing technique can also be used.

The aluminum pastes of the present invention can be used as such or may be diluted, for example, by the addition of additional organic solvent(s); accordingly, the weight percentage of all the other constituents of the aluminum paste may be decreased.

The aluminum pastes of the present invention may be used in the manufacture of aluminum back electrodes of silicon solar cells or respectively in the manufacture of silicon solar cells. The manufacture may be performed by applying the aluminum pastes to the back-side of silicon wafers, i.e., to those surface portions thereof which are or will not be covered by other back-side metal pastes like, in particular, back-side silver or silver/aluminum pastes. The silicon wafers may comprise monocrystalline or polycrystalline silicon. In an embodiment, the silicon wafers may have an area of 100 to 250 cm$^2$ and a thickness of 180 to 300 µm. However, the aluminum pastes of the present invention can be successfully used even for the production of aluminum back electrodes on the back-side of silicon wafers that are larger and/or having a lower thickness, for example, silicon wafers having a thickness below 180 µm, in particular in the range of 140 to below 180 µm and/or an area in the range of above 250 to 400 cm$^2$.

The aluminum pastes are applied to a dry film thickness of, for example, 15 to 60 µm. Typically, they are applied as a single layer to the back-side of the silicon wafers. The method of aluminum paste application may be printing, for example, silicone pad printing or, in an embodiment, screen printing. The application viscosity of the aluminum pastes of the present invention may be 20 to 200 Pa·s when it is measured at a spindle speed of 10 rpm and 25° C. by a utility cup using a Brookfield HBT viscometer and #14 spindle.

After application of the aluminum pastes to the back-side of the silicon wafers they may be dried, for example, for a period of 1 to 100 minutes with the wafers reaching a peak temperature in the range of 100 to 300° C. Drying can be carried out making use of, for example, belt, rotary or stationary driers, in particular, IR (infrared) belt driers.

After their application or, in an embodiment, after their application and drying, the aluminum pastes of the present invention are fired to form aluminum back electrodes. Firing may be performed, for example, for a period of 1 to 5 minutes with the silicon wafers reaching a peak temperature in the range of 700 to 900° C. Firing can be carried out making use of, for example, single or multi-zone belt furnaces, in particular, multi-zone IR belt furnaces. Firing happens in the presence of oxygen, in particular, in the presence of air. During firing the organic substance including non-volatile organic material and the organic portion not evaporated during the possible drying step may be removed, i.e. burned and/or carbonized, in particular, burned. The organic substance removed during firing includes organic solvent(s), possible organic polymer(s) and possible organic additive(s). In an embodiment in which the aluminum pastes comprise glass frit(s), there may be a further process taking place during firing, namely sintering of the glass frit(s). Firing may be performed as so-called cofiring together with further metal pastes that have been applied to the silicon wafer, i.e., front-side and/or back-side metal pastes which have been applied to form front-side and/or back-side electrodes on the wafer's surfaces during the firing process. An embodiment, includes front-side silver pastes and back-side silver or back-side silver/aluminum pastes.

Next, a non-limiting example in which a silicon solar cell is prepared using an aluminum paste of the present invention is explained, referring to FIG. 2.

Figure 2A:
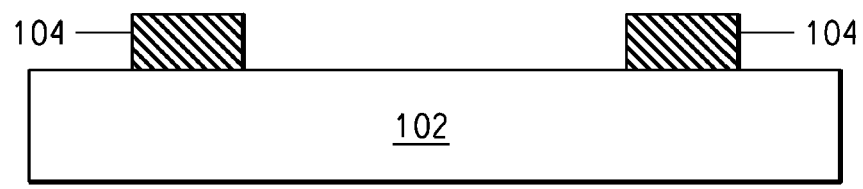
Figure 2B:
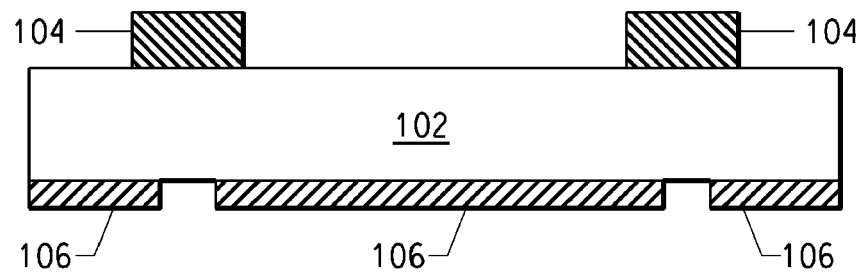
Figure 2C:
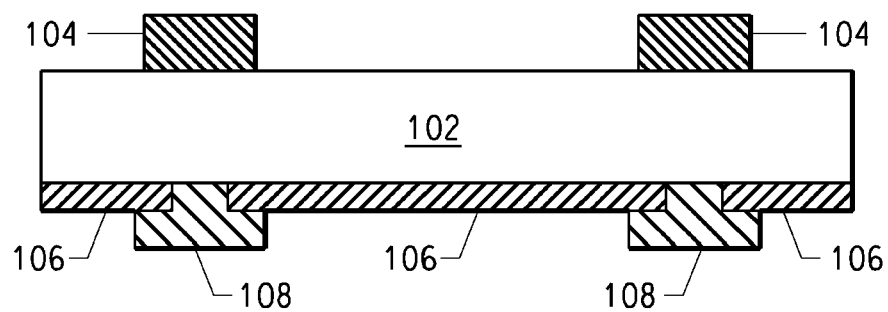

First, a silicon wafer substrate 102 is prepared. On the light-receiving side face (front-side surface) of the silicon wafer, normally with the p-n junction close to the surface, front-side electrodes (for example, electrodes mainly composed of silver) 104 are installed (FIG. 2A). On the back-side of the silicon wafer, a silver or silver/aluminum electroconductive paste (for example, PV202 or PV502 or PV583 or PV581, commercially available from E.I. Du Pont de Nemours and Company) is spread to form either busbars or tabs to enable interconnection with other solar cells set in parallel electrical configuration. On the back-side of the silicon wafer, a novel aluminum paste of the present invention used as a back-side (or p-type contact) electrode for a solar cell, 106 is spread by screen printing using the pattern that enable slight overlap with the silver or silver/aluminum paste referred to above, etc., then dried (FIG. 2B). Drying of the pastes is performed, for example, in an IR belt drier for a period of 1 to 10 minutes with the wafer reaching a peak temperature of 100 to 300° C. Also, the aluminum paste may have a dried film thickness of 15 to 60 µm, and the thickness of the silver or silver/aluminum paste may be 15 to 30 µm. Also, the overlapped part of the aluminum paste and the silver or silver/aluminum paste may be about 0.5 to 2.5 mm.

Figure 2D:
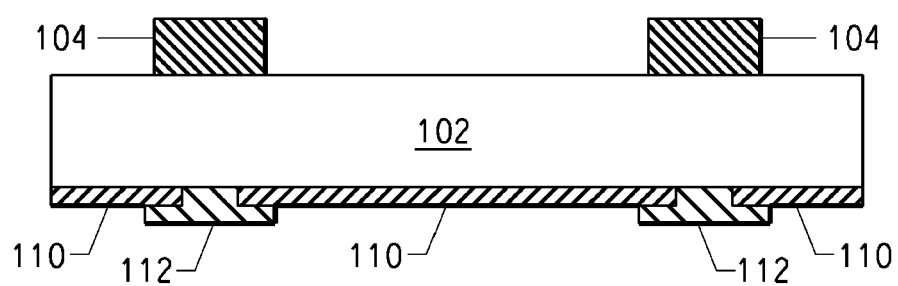

Next, the substrate obtained is fired, for example, in a belt furnace for a period of 1 to 5 minutes with the wafer reaching a peak temperature of 700 to 900° C., so that the desired silicon solar cell is obtained (FIG. 2D). An electrode 110 is formed from the aluminum paste wherein said paste has been fired to remove the organic substance and, in case the aluminum paste comprises glass frit, to sinter the latter.

The silicon solar cell obtained using the aluminum paste of the present invention, as shown in FIG. 2D, has electrodes 104 on the light-receiving face (surface) of the silicon substrate 102, aluminum electrodes 110 mainly composed of aluminum and silver or silver/aluminum electrodes 112 mainly composed of silver or silver and aluminum (formed by firing silver or silver/aluminum paste 108), on the back-side.

EXAMPLES (1) Manufacture of Solar Cell
A solar cell was formed as follows:
(i) On the back face of a Si substrate (160 µm thick multicrystalline silicon wafer of area 243 cm$^2$, p-type (boron) bulk silicon, with an n-type diffused POCl$_3$ emitter, surface texturized with acid, SiN$_x$ anti-reflective coating (ARC) on the wafer's emitter applied by CVD) having a 20 µm thick silver electrode on the front surface (PV145 Ag composition commercially available from E.I. Du Pont de Nemours and Company) an Ag/Al paste (PV202, an Ag/Al composition commercially available from E.I. Du Pont de Nemours and Company) was printed and dried as 5 mm wide bus bars. Then, an aluminum paste for the back face electrode of a solar cell was screen-printed at a dried film thickness of 30 µm providing overlap of the aluminum film with the Ag/Al busbar for 1 mm at both edges to ensure electrical continuity. The screen-printed aluminum paste was dried before firing.

The example aluminum pastes comprised 72.5 wt % aluminium powder (average particle size in each case 6 μm), 27.5 wt. % organic vehicle of polymeric resins and organic solvents. The aluminium powder in the control paste A comprised entirely air-atomized (nodular-shaped) powder. The aluminium powder in pastes B to E (according to the invention) comprised mixtures of air and nitrogen atomized (nodular-shaped and spherical-shaped) powders with a share of 10 to 90 wt. % of spherical-shaped powder. The aluminium powder in the control paste F comprised entirely nitrogen atomized (spherical-shaped) powder.

(ii) The printed wafers were then fired in a Centrotherm furnace at a belt speed of 3000 mm/min with zone temperatures defined as zone 1=450° C., zone 2=520° C., zone 3=570° C. and the final zone set at 950° C., thus the wafers reaching a peak temperature of 850° C. After firing, the metallized wafers became functional photovoltaic devices.

Measurement of the electrical performance and bowing was undertaken.

(2) Test Procedures

Efficiency

The solar cells formed according to the method described above were placed in a commercial I-V tester (supplied by EETS Ltd.) for the purpose of measuring light conversion efficiencies. The lamp in the I-V tester simulated sunlight of a known intensity (approximately 1000 W/m$^2$) and illuminated the emitter of the cell. The metallizations printed onto the fired cells were subsequently contacted by four electrical probes. The photocurrent (Voc, open circuit voltage; Isc, short circuit current) generated by the solar cells was measured over arrange of resistances to calculate the I-V response curve. Fill Factor (FF) and Efficiency (Eff) values were subsequently derived from the I-V response curve.

Bowing Measurement

Bowing (cell warpage) is defined as the maximum deflection height of the centre of the fired cell at room temperature when measured upon a flat surface. Bowing measurements were performed by placing the cells on a metal flat-bed and using a dial gauge with μm resolution to measure the maximum deflection of each cell, i.e. determining the distance of the centre of the wafer from the flat bed surface.

Examples A to F cited in Table 1 illustrate the electrical properties and the bowing behavior of the aluminum pastes as a function of the share of the spherical-shaped aluminum powder. The data in Table 1 confirms that the solar cells made using aluminum pastes according to Examples B to E show a better balance between electrical performance and bowing of the cells compared to those made using the aluminum pastes of control pastes A and F.

TABLE 1

| Example | Share of spherical-shaped aluminum powder (wt. %) | Voc (mV) | Isc (A) | Eff (%) | FF (%) | Bowing (μm) |
| --- | --- | --- | --- | --- | --- | --- |
| A | 0 | 591.9 | 8.83 | 15.45 | 71.69 | 1902 |
| B | 30 | 597.1 | 8.89 | 15.88 | 72.53 | 2026 |
| C | 50 | 598.0 | 8.86 | 15.82 | 72.86 | 1703 |
| D | 70 | 600.2 | 8.98 | 15.99 | 72.27 | 1651 |
| E | 90 | 600.4 | 8.97 | 16.14 | 72.96 | 1659 |
| F | 100 | 599.9 | 8.79 | 15.73 | 72.63 | 1707 |

What is claimed is:

1. An aluminum paste comprising particulate aluminum and an organic vehicle comprising organic solvent(s), wherein the particulate aluminum comprises 50 to 90 wt. % of spherical-shaped aluminum powder and 10 to 50 wt. % of nodular-shaped aluminum powder, the wt. % being based on the sum of the spherical-shaped aluminum powder and the nodular-shaped aluminum powder, wherein both the spherical-shaped aluminum powder and the nodular-shaped aluminum powder have a D50 particle size of 4 μm to 12 μm.

2. The aluminum paste of claim 1, wherein the particulate aluminum comprises 50 to 75 wt. % of spherical-shaped aluminum powder and 25 to 50 wt. % of nodular-shaped aluminum powder, the wt. % being based on the sum of the spherical-shaped aluminum powder and the nodular-shaped aluminum powder.

3. The aluminum paste of claim 2, wherein the particulate aluminum comprises 60 to 70 wt. % of spherical-shaped aluminum powder and 30 to 40 wt. % of nodular-shaped aluminum powder, the wt. % being based on the sum of the spherical-shaped aluminum powder and the nodular-shaped aluminum powder.

4. The aluminum paste of claim 1, wherein the sum of spherical-shaped plus nodular-shaped aluminum powder accounts for more than 90 wt. % of the particulate aluminum.

5. The aluminum paste of claim 1, wherein the sum of spherical-shaped plus nodular-shaped aluminum powder accounts for 100 wt. % of the particulate aluminum.

6. The aluminum paste of claim 1, wherein the particulate aluminum is present in a proportion of 50 to 80 wt. %, based on total aluminum paste composition.

7. The aluminum paste of claim 1 additionally comprising one or more glass frits in a total proportion of 0.01 to 5 wt. %, based on total aluminum paste composition.

8. The aluminum paste of claim 1, wherein the organic vehicle further comprises organic polymer(s) and/or organic additive(s).

9. A process of forming a silicon solar cell comprising the steps:
(i) applying an aluminum paste of claim 1 on the back-side of a silicon wafer having a p-type region, an n-type region and a p-n junction, and
(ii) firing the surface provided with the aluminum paste, whereby the wafer reaches a peak temperature of 700 to 900° C.

10. The process of claim 9, wherein the application of the aluminum paste is performed by printing.

11. The process of claim 9, wherein firing is performed as cofiring together with other front-side and/or back-side metal pastes that have been applied to the silicon wafer to form front-side and/or back-side electrodes thereon during firing.

12. A silicon solar cell comprising an aluminum back electrode wherein the aluminum back electrode is produced making use of an aluminum paste of claim 1.

13. The silicon solar cell of claim 12, further comprising a silicon wafer.

* * * * *